(12) United States Patent
Chen et al.

(10) Patent No.: US 10,897,198 B2
(45) Date of Patent: Jan. 19, 2021

(54) VOLTAGE CONVERSION APPARATUS AND CONTROL METHOD THEREFOR

(71) Applicant: ASUSTeK COMPUTER INC., Taipei (TW)

(72) Inventors: Tao Chen, Taipei (TW); Xiao-Feng Zhou, Taipei (TW); Ching-Ji Liang, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 326 days.

(21) Appl. No.: 16/128,091

(22) Filed: Sep. 11, 2018

(65) Prior Publication Data

US 2019/0089248 A1  Mar. 21, 2019

(30) Foreign Application Priority Data

Sep. 15, 2017 (CN) .......................... 2017 1 0830925

(51) Int. Cl.
| | |
|---|---|
| *H02M 3/158* | (2006.01) |
| *H02H 7/10* | (2006.01) |
| *H02M 1/36* | (2007.01) |
| *G01R 19/165* | (2006.01) |
| *H02M 1/08* | (2006.01) |
| *H02H 3/00* | (2006.01) |

(Continued)

(52) U.S. Cl.
CPC ...... *H02M 3/158* (2013.01); *G01R 19/16552* (2013.01); *H02H 3/00* (2013.01); *H02M 1/08* (2013.01); *H02M 1/32* (2013.01); *H02M 1/36* (2013.01); *H03K 5/24* (2013.01)

(58) Field of Classification Search
CPC ... H02M 3/158; G01R 19/16552; H02H 3/00; H02H 7/10; H02H 7/1216
See application file for complete search history.

(56) References Cited

U.S. PATENT DOCUMENTS

| | | | | |
|---|---|---|---|---|
| 6,465,993 | B1 * | 10/2002 | Clarkin ................. | H02M 3/156 323/272 |
| 6,894,471 | B2 * | 5/2005 | Corva ................... | H02M 3/156 323/282 |

(Continued)

FOREIGN PATENT DOCUMENTS

TW          I385887 B1    2/2013

*Primary Examiner* — Scott Bauer
(74) *Attorney, Agent, or Firm* — McClure, Qualey & Rodack, LLP

(57) ABSTRACT

A voltage conversion apparatus includes a power supply circuit with a first switch, a voltage conversion circuit, and a protective circuit with a detection circuit. The first switch transmits a power to generate an input voltage. The voltage conversion circuit generates a first voltage. A second switch of the voltage conversion circuit receives the input voltage. A third switch of the voltage conversion circuit is coupled between the second switch and a ground terminal. The detection circuit generates a first control signal based on the first voltage, a second voltage that corresponds to the first voltage, and a reference voltage. When a voltage value of an error signal is less than the reference voltage, the detection circuit outputs the first control signal to turn off the first switch. The voltage value of the error signal corresponds to a voltage difference between the first voltage and the second voltage.

11 Claims, 4 Drawing Sheets

(51) Int. Cl.
*H02M 1/32* (2007.01)
*H03K 5/24* (2006.01)

(56) References Cited

U.S. PATENT DOCUMENTS

| | | | | |
|---|---|---|---|---|
| 8,901,912 | B2* | 12/2014 | Lee | H02M 3/158 |
| | | | | 323/288 |
| 9,711,966 | B2* | 7/2017 | Haeffner | H02J 4/00 |
| 2006/0170405 | A1* | 8/2006 | Hasegawa | H02M 3/1588 |
| | | | | 323/284 |
| 2011/0007434 | A1 | 1/2011 | Han et al. | |
| 2014/0152239 | A1* | 6/2014 | Yao | H02J 7/00718 |
| | | | | 320/107 |
| 2015/0277457 | A1* | 10/2015 | Sakaguchi | H02M 7/48 |
| | | | | 363/49 |
| 2016/0172980 | A1 | 6/2016 | Byun et al. | |
| 2017/0126113 | A1* | 5/2017 | Ejury | H03K 17/164 |

* cited by examiner

VOLTAGE CONVERSION APPARATUS AND CONTROL METHOD THEREFOR

CROSS-REFERENCE TO RELATED APPLICATION

This application claims the priority benefit of Chinese application serial CN 201710830925.2, filed on Sep. 15, 2017. The entirety of the above-mentioned patent application is hereby incorporated by reference herein and made a part of the specification.

BACKGROUND OF THE INVENTION

Field of the Invention

The present invention relates to a voltage conversion apparatus and a control method therefor.

Description of the Related Art

Voltage converters are widely applied to various electronic apparatuses. A voltage converter is configured to perform voltage conversion on an input voltage to generate an output voltage. However, when an impedance anomaly is occurring in the voltage converter or an anomaly is occurring to an internal switch (for example, a high side switch) of the voltage converter, if the input voltage is continuously input to the voltage converter, the internal switch of the voltage converter may be burnt out, causing a hot-melting problem.

BRIEF SUMMARY OF THE INVENTION

According to first aspect of the disclosure, a voltage conversion apparatus is provided. The voltage conversion apparatus includes a power supply circuit, a voltage conversion circuit, and a protective circuit. The power supply circuit includes a first switch. The first switch transmits a power to generate an input voltage. The voltage conversion circuit generates a first voltage. A second switch of the voltage conversion circuit receives the input voltage. A third switch of the voltage conversion circuit is coupled between the second switch and a ground terminal. The protective circuit includes a detection circuit. The detection circuit generates a first control signal based on the first voltage, a second voltage that corresponds to the first voltage, and a reference voltage. When a voltage value of an error signal is less than the reference voltage, the detection circuit outputs the first control signal to turn off the first switch. The voltage value of the error signal corresponds to a voltage difference between the first voltage and the second voltage.

According to second aspect of the disclosure, a control method for a voltage conversion apparatus is provided. The control method for a voltage conversion apparatus includes: transmitting a power by a first switch of a power supply circuit to generate an input voltage; receiving the input voltage by a second switch of a voltage conversion circuit, where a third switch is coupled between the second switch and a ground terminal; generating an output voltage and a first voltage based on the input voltage by the voltage conversion circuit; and generating a first control signal based on the first voltage, a second voltage that corresponds to the first voltage, and a reference voltage by a detection circuit. When a voltage value of an error signal is less than the reference voltage, the detection circuit outputs the first control signal to turn off the first switch. The voltage value of the error signal corresponds to a voltage difference between the first voltage and the second voltage.

In conclusion, according to the voltage conversion apparatus and the control method therefor in the present disclosure, when an impedance anomaly is occurring between pins of the protective circuit or an anomaly is occurring to a high side switch, the protective circuit controls the power supply circuit to stop providing the input voltage to the high side switch. In this way, the high side switch can be prevented from having a hot-melting problem.

BRIEF DESCRIPTION OF THE DRAWINGS

To make the foregoing and other objectives, features, advantages, and embodiments of the specification more comprehensible, descriptions of the accompanying drawings are as follows.

DETAILED DESCRIPTION OF THE EMBODIMENTS

The terms "first", "second", "third", and so on used in the specification are merely intended to distinguish between elements or operations described by using the same technical terms but do not necessarily indicate a specific order or sequence and are not intended to limit the present disclosure.

The term "coupling" used in the specification may refer to "electrical coupling", and the term "connection" may refer to "electrical connection". "Coupling" and "connection" may also refer to engagement or interaction performed between two or more elements.

Figure 1:
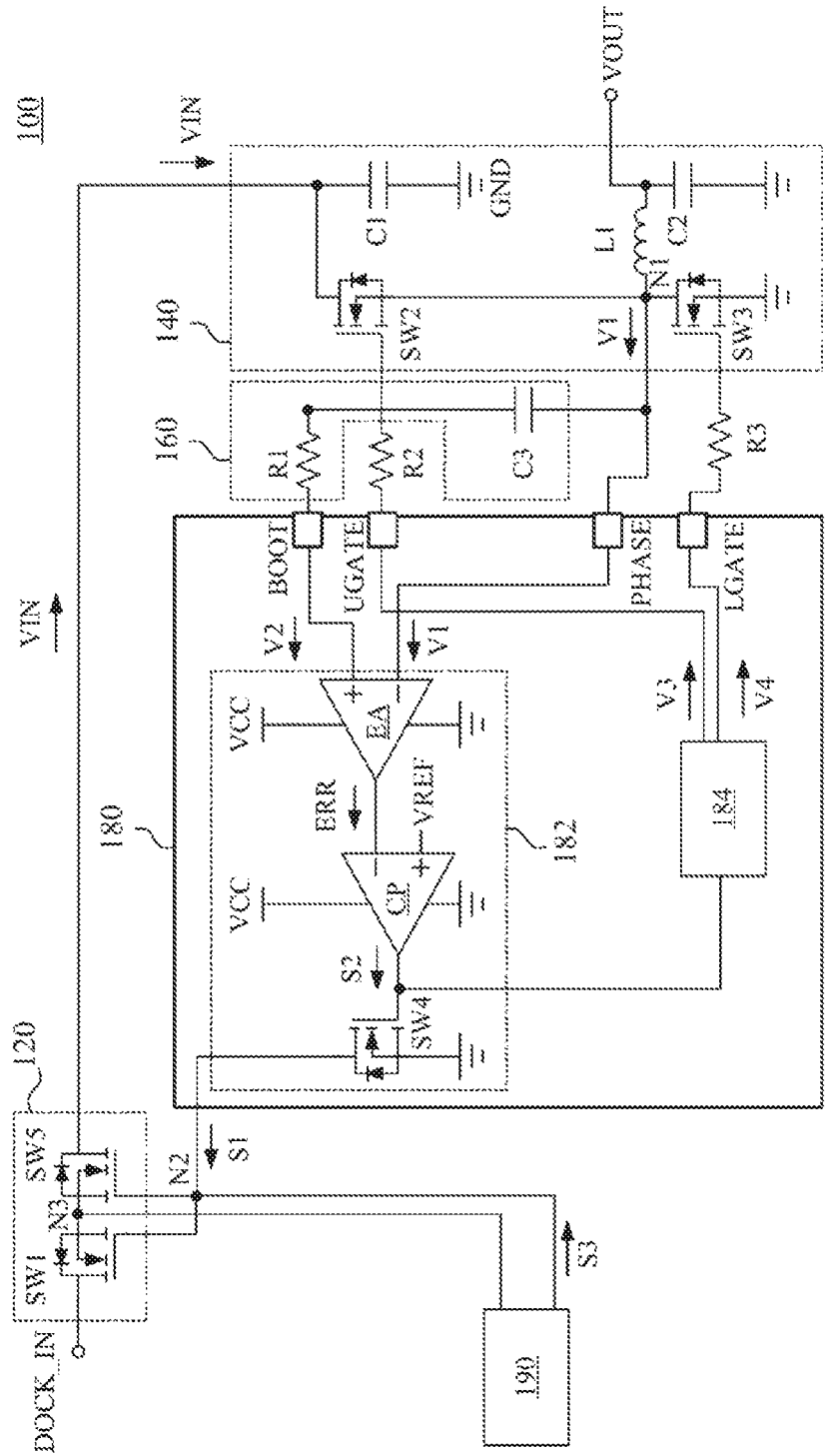
FIG. 1 is a schematic diagram of a voltage conversion apparatus according to an embodiment of the present disclosure.

Referring to FIG. 1, FIG. 1 is a schematic diagram of a voltage conversion apparatus 100 according to an embodiment of the present disclosure. In an embodiment, the voltage conversion apparatus 100 is a buck converter (buck converter). The voltage conversion apparatus 100 includes a power supply circuit 120, a voltage conversion circuit 140, a boot circuit 160, a protective circuit 180, and a second control circuit 190.

The power supply circuit 120 includes a first switch SW1 and a fifth switch SW5. The first switch SW1 and the fifth switch SW5 are connected with each other in a series opposing connection. A first end of the first switch SW1 receives a power DOCK_IN, a second end of the first switch SW1 and a first end of the fifth switch SW5 are coupled to a node N3, and a second end of the fifth switch SW5 is coupled to the voltage conversion circuit 140, to provide an input voltage VIN to the voltage conversion circuit 140. Control ends of the first switch SW1 and the fifth switch SW5 are coupled to a node N2 to receive a control signal S1 from the protective circuit 180 or a control signal S3 from the second control circuit 190. The control signal S1 or the control signal S3 are configured to control the first switch SW1 and the fifth switch SW5 to be turned on or turned off. When the first switch SW1 and the fifth switch SW5 are turned on, the first switch SW1 and the fifth switch SW5 transmit the power DOCK_IN to generate the input voltage VIN.

In an embodiment, the voltage conversion circuit 140 includes a first capacitor C1, a second capacitor C2, a first inductor L1, a second switch SW2, and a third switch SW3. A first end of the first capacitor C1 and a first end of the second switch SW2 receive the input voltage VIN from the power supply circuit 120. A first end of the second capacitor C2 is coupled to a first end of the first inductor L1. A second end of the first capacitor C1, a second end of the second capacitor C2, and a first end of the third switch SW3 are coupled to a ground terminal GND. A second end of the second switch SW2, a second end of the third switch SW3, and a second end of the first inductor L1 are coupled to a node N1. When receiving the input voltage VIN, the voltage conversion circuit 140 performs voltage conversion on the input voltage VIN to generate an output voltage VOUT at the first end of the first inductor L1 and generate a first voltage V1 at the second end (the node N1) of the first inductor L1.

The boot circuit 160 is coupled between the voltage conversion circuit 140 and the protective circuit 180. In an embodiment, the boot circuit 160 includes a third capacitor C3 and a first resistor R1. A first end of the third capacitor C3 is coupled to the node N1, a second end of the third capacitor C3 is coupled to a first end of the first resistor R1, and a second end of the first resistor R1 is coupled to the protective circuit 180. A second voltage V2 (for example, a boot voltage) is generated at the second end of the first resistor R1 after the first voltage V1 at the node N1 experiences a bootstrap effect of the boot circuit 160.

In an embodiment, the protective circuit 180 includes a first pin PHASE, a second pin BOOT, a third pin UGATE, a fourth pin LGATE, a detection circuit 182, and a first control circuit 184.

The detection circuit 182 includes an error amplifier EA, a comparator CP, and a fourth switch SW4. In an embodiment, both the error amplifier EA and the comparator CP receive an operating voltage VCC to perform an operation. A first input end (for example, a negative input end) of the error amplifier EA is coupled to the first pin PHASE to receive the first voltage V1 by the first pin PHASE. A second input end (for example, a positive input end) of the error amplifier EA is coupled to the second pin BOOT to receive the second voltage V2 by the second pin BOOT. A voltage difference between the first voltage V1 and the second voltage V2 corresponds to an error signal ERR. In an embodiment, the error amplifier EA amplifies the voltage difference between the first voltage V1 and the second voltage V2 to generate the error signal ERR. The error signal ERR is transmitted to a first input end (for example, a negative input end) of the comparator CP. A reference voltage VREF is transmitted to a second input end (for example, a positive input end) of the comparator CP. Then, the comparator CP compares a voltage value of the error signal ERR with the reference voltage VREF, and outputs a control signal S2 based on a comparison result. In an embodiment, when the reference voltage VREF is greater than (or less than) the voltage value of the error signal ERR, the control signal S2 has a logical value 1 (or 0). In an embodiment, the reference voltage VREF is 2.5 volts. An output end of the comparator CP is coupled to a control end of the fourth switch SW4 to transmit the control signal S2 to the control end of the fourth switch SW4. The fourth switch SW4 is coupled between the node N2 and the ground terminal GND, and the control signal S2 is configured to control the fourth switch SW4 to be turned on or turned off.

In an embodiment, the first switch SW1, the second switch SW2, the third switch SW3, the fourth switch SW4, and the fifth switch SW5 are separately implemented by using a single N-type metal-oxide semiconductor field-effect transistor (MOSFET). The transistor types of the switches are not limited by the content of the present disclosure. The transistor types based on which the switches can be implemented fall within the content scope of the present disclosure. In an embodiment, the transistor types of the switches may be a bipolar junction transistor (BJT) or an insulated gate bipolar transistor (IGBT).

Figure 2A:
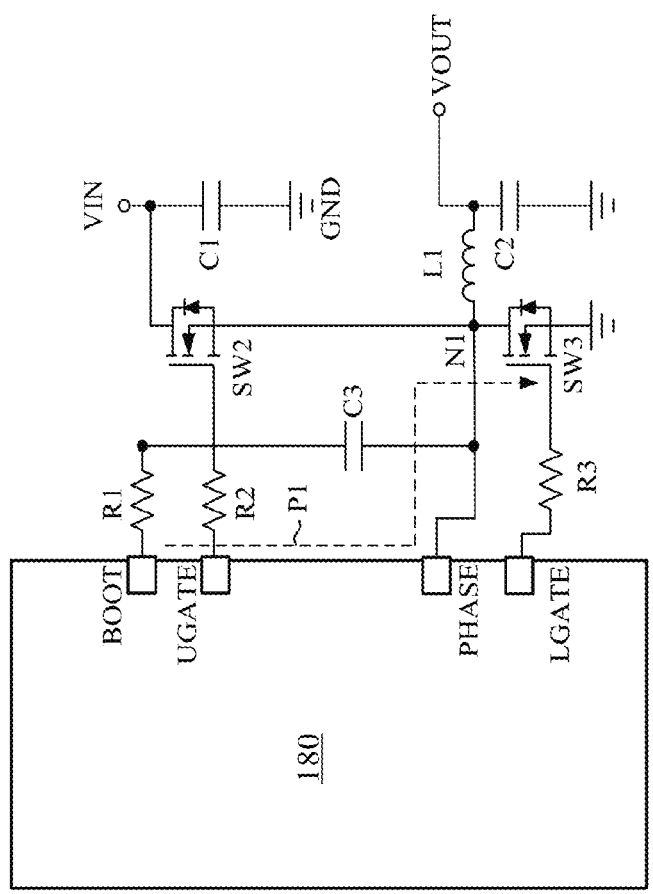
FIG. 2A and FIG. 2B are a schematic diagram of an impedance anomaly according to an embodiment.
Figure 2B:
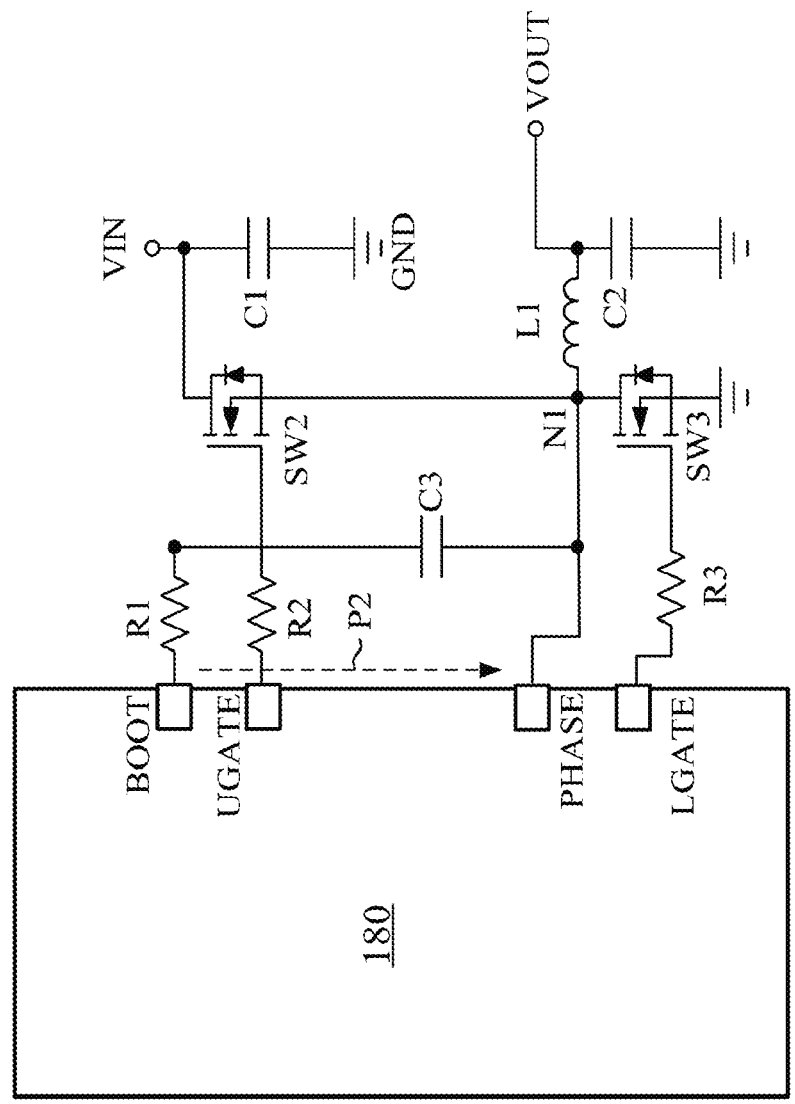

When an impedance anomaly is occurring between the pins of the protective circuit 180 or when an anomaly is occurring to the second switch SW2, the voltage difference between the first voltage V1 and the second voltage V2 may correspondingly become smaller. The related content is described with reference to FIG. 2A and FIG. 2B. FIG. 2A and FIG. 2B are a schematic diagram of an impedance anomaly according to an embodiment.

Referring to FIG. 2A, when an impedance anomaly is occurring between the second pin BOOT and the third pin UGATE, an anomaly conductive path exists between the second pin BOOT and the third pin UGATE. When the third switch SW3 is turned on, a conductive path exists between the third pin UGATE and the first pin PHASE. Therefore, when the impedance anomaly is occurring between the second pin BOOT and the third pin UGATE and the third switch SW3 is turned on, a first discharge path P1 exists. When the first discharge path P1 exists, the voltage difference between the first voltage V1 received by the first pin PHASE and the second voltage V2 received by the second pin BOOT becomes smaller.

Referring to FIG. 2B, when an impedance anomaly is occurring between the third pin UGATE and the first pin PHASE, an anomaly conductive path exists between the third pin UGATE and the first pin PHASE. When the second switch SW2 is turned on or anomalous (for example, damage), a conductive path exists between the second pin BOOT and the third pin UGATE. Therefore, when the impedance anomaly is occurring between the third pin UGATE and the first pin PHASE and the second switch SW2 is turned on or anomalous, a second discharge path P2 exists. In another embodiment, when an impedance anomaly is occurring between the second pin BOOT and the first pin PHASE, the second discharge path P2 also exists. When the second discharge path P2 exists, the voltage difference between the first voltage V1 received by the first pin PHASE and the second voltage V2 received by the second pin BOOT becomes smaller.

Still referring to FIG. 1, in an embodiment, when the voltage difference between the first voltage V1 and the second voltage V2 becomes smaller, the voltage value of the error signal ERR is less than the reference voltage VREF. When the voltage value of the error signal ERR is less than the reference voltage VREF, the comparator CP outputs the control signal S2 with the logical value "1". The fourth switch SW4 is turned on based on the control signal S2 with the logical value "1". When the fourth switch SW4 is turned on, the voltage at the node N2 is pulled down to the ground by the fourth switch SW4. At this time, the control signal S1 outputting by the fourth switch SW4 has a logical value "0". When the control signal S1 has the logical value "0", the first switch SW1 and the fifth switch SW5 are turned off based on the control signal S1 with the logical value "0". In this way, the power supply circuit 120 cannot transmit the power DOCK_IN to provide the input voltage VIN to the second switch SW2 of the voltage conversion circuit 140. Therefore, the second switch SW2 is prevented from having a hot-melting problem, to protect the voltage conversion apparatus 100.

An input end of the first control circuit 184 is coupled to the comparator CP to receive the control signal S2. The first control circuit 184 selectively outputs the third voltage V3 and the fourth voltage V4 based on the logical value of the control signal S2. A first output end of the first control circuit 184 is coupled to the third pin UGATE, and the second resistor R2 is coupled between the third pin UGATE and the control end of the second switch SW2 to transmit the third voltage V3 from the first control circuit 184 to the control end of the second switch SW2. The third voltage V3 is configured to control the second switch SW2 to be turned on or turned off. A second output end of the first control circuit 184 is coupled to the fourth pin LGATE, and a third resistor R3 is coupled between the fourth pin LGATE and the control end of the third switch SW3 to transmit the fourth voltage V4 from the first control circuit 184 to the control end of the third switch SW3. The fourth voltage V4 is configured to control the third switch SW3 to be turned on or turned off.

In an embodiment, when no anomaly is occurring, the voltage value of the error signal ERR is not less than the reference voltage VREF. When the voltage value of the error signal ERR is not less than the reference voltage VREF, the control signal S2 output by the comparator CP has a logical value "0". When the first control circuit 184 receives the control signal S2 with the logical value "0", the first control circuit 184 generates the third voltage V3 and the fourth voltage V4. The third voltage V3 is transmitted to the control end of the second switch SW2 by the third pin UGATE and the second resistor R2 to control the second switch SW2 to be turned on or turned off, and the fourth voltage V4 is transmitted to the control end of the third switch SW3 by the fourth pin LGATE and the third resistor R3 to control the third switch SW3 to be turned on or turned off. In an embodiment, the first control circuit 184 is a pulse width modulator (PWM) controller, and the third voltage V3 and the fourth voltage V4 are PWM signals. As described above, when the anomaly is occurring, the control signal S2 has the logical value "1". In this case, the first control circuit 184 is disabled based on the control signal S2 with the logical value "1". The disabled first control circuit 184 stops outputting the third voltage V3 and the fourth voltage V4.

The second control circuit 190 is coupled between the node N3 and the node N2. In an embodiment, the second control circuit 190 detects a voltage at the node N3 and outputs the control signal S3 to the node N2 based on a detection result, to control the first switch SW1 and the fifth switch SW5 to be turned on or turned off so as to further control the power supply circuit 120 to transmit the power DOCK_IN or not. In an embodiment, the second control circuit 190 and the first control circuit 184 are control chips.

Figure 3:
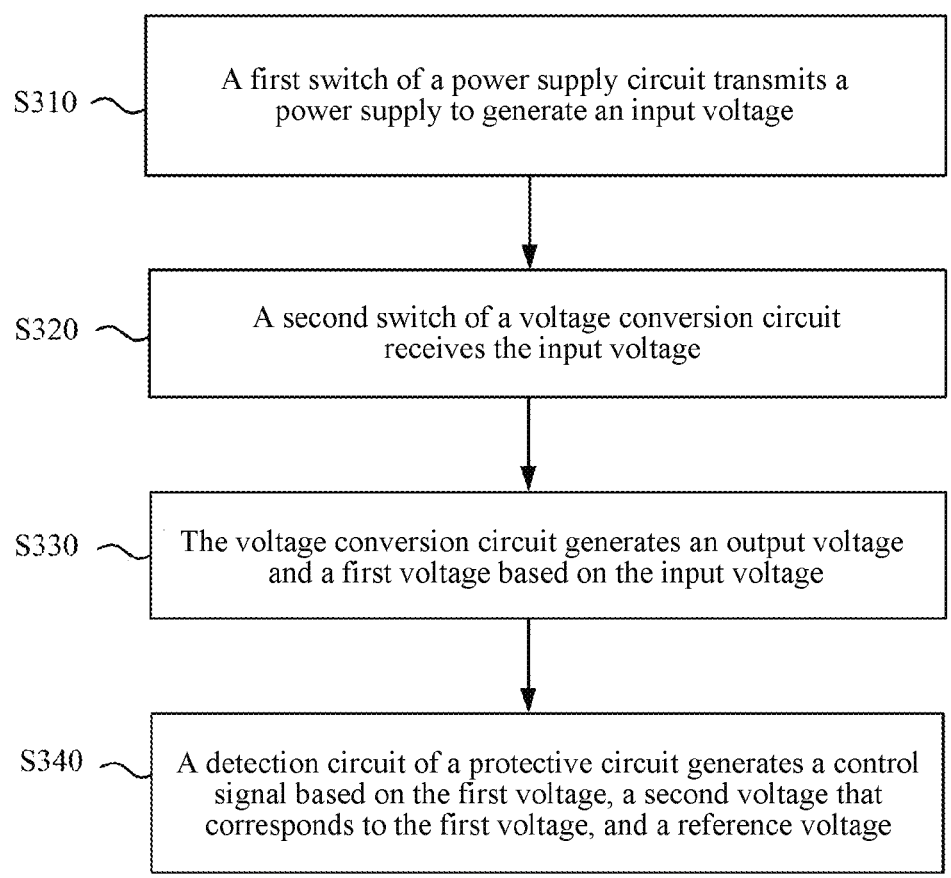
FIG. 3 is a flowchart of a control method for a voltage conversion apparatus according to an embodiment of the present disclosure.

Referring to FIG. 3, FIG. 3 is a flowchart of a control method 300 for a voltage conversion apparatus according to an embodiment of the present disclosure. To understand the content of the present disclosure in a preferred manner, the control method 300 is discussed with reference to the voltage conversion apparatus 100 in FIG. 1, but the content of the present disclosure is not limited thereto.

In an embodiment, the control method 300 includes step S310, step S320, step S330, and step S340.

In step S310, at least one first switch of the power supply circuit 120 transmits the power DOCK_IN to generate the input voltage VIN. In an embodiment, the power supply circuit 120 includes the first switch SW1 and the fifth switch SW5. When the control signal S1 has the logical value "0", the first switch SW1 and the fifth switch SW5 are turned on. The first switch SW1 and the fifth switch SW5 transmit the power DOCK_IN to generate the input voltage VIN. In an embodiment, the input voltage VIN is 12 volts.

In step S320, the second switch SW2 of the voltage conversion circuit 140 receives the input voltage VIN. In an embodiment, the second switch SW2 is a high side switch, and the third switch SW3 is a low side switch. The voltage conversion circuit 140 receives the input voltage VIN from the power supply circuit 120 by the second switch SW2, to perform a voltage conversion operation on the input voltage VIN.

In step S330, the voltage conversion circuit 140 generates the output voltage VOUT and the first voltage V1 based on the input voltage VIN. In an embodiment, the voltage conversion circuit 140 performs the voltage conversion on the input voltage VIN to generate the output voltage VOUT at the first end of the first inductor L1 and generate the first voltage V1 at the second end (the node N1) of the first inductor L1.

In step S340, the detection circuit 182 of the protective circuit 180 generates the control signal S1 based on the first voltage V1, the second voltage V2 that corresponds to the first voltage V1, and the reference voltage VREF. In an embodiment, the error amplifier EA outputs the error signal ERR based on the voltage difference between the first voltage V1 and the second voltage V2. When the voltage value of the error signal ERR is less than the reference voltage VREF, the comparator CP outputs the control signal S2 with the logical value "1". The fourth switch SW4 receives the control signal S2 with the logical value "1" and is turned on based on the control signal S2 with the logical value "1" to output the control signal S1 with the logical value "0". The control signal S1 with the logical value "0" is transmitted to the node N2, so that the first switch SW1 and the fifth switch SW5 are turned off. In this way, the power DOCK_IN cannot be transmitted by the first switch SW1 and the fifth switch SW5, and the power supply circuit 120 stops providing the input voltage VIN to the second switch SW2.

In conclusion, according to the voltage conversion apparatus and the control method therefor in the present disclosure, when the impedance anomaly is occurring between the pins of the protective circuit or the anomaly is occurring to the high side switch, the protective circuit controls the power supply circuit to stop providing the input voltage to the high side switch. In this way, the high side switch can be prevented from having a hot-melting problem.

Although the present invention has been disclosed with reference to embodiments thereof, the embodiments are not for limiting the present invention. Persons skilled in the art may make various modifications and polishing without departing from the spirit and scope of the present invention. Therefore, the protection scope of the present invention shall be subject to the protection scope of the claims.

Although the present invention has been described in considerable detail with reference to certain preferred embodiments thereof, the disclosure is not for limiting the scope of the invention. Persons having ordinary skill in the art may make various modifications and changes without departing from the scope. Therefore, the scope of the appended claims should not be limited to the description of the preferred embodiments described above.

What is claimed is:

1. A voltage conversion apparatus, comprising:
   a power supply circuit, comprising a first switch that configured to transmit power to generate an input voltage; and
   a voltage conversion circuit, generating an output voltage and a first voltage based on the input voltage, and the voltage conversion circuit comprises:
      a second switch, receiving the input voltage; and
      a third switch, coupling the second switch and a ground terminal; and
   a protective circuit, comprising:
      a detection circuit, generating a first control signal based on the first voltage, a second voltage that corresponds to the first voltage, and a reference voltage, wherein when a voltage value of an error signal is less than the reference voltage, the detection circuit outputs the first control signal to turn off the first switch, and the voltage value of the error signal corresponds to a voltage difference between the first voltage and the second voltage.

2. The voltage conversion apparatus according to claim 1, wherein the detection circuit comprises:
   an error amplifier, generating the error signal based on the first voltage and the second voltage;
   a comparator, comparing the voltage value of the error signal with the reference voltage to generate a second control signal; and
   a fourth switch, being turned on or turned off based on the second control signal to generate the first control signal.

3. The voltage conversion apparatus according to claim 2, wherein the protective circuit further comprises:
   a first control circuit, coupled between the comparator and the voltage conversion circuit, wherein when the voltage value of the error signal is less than the reference voltage, the first control circuit is disabled based on the second control signal, to stop outputting a third voltage to a control end of the second switch and stop outputting a fourth voltage to a control end of the third switch.

4. The voltage conversion apparatus according to claim 1, wherein the second switch comprises a first end and a second end, the first end of the second switch receives the input voltage to generate the first voltage at the second end of the second switch, the second end of the second switch is coupled to a first pin of the protective circuit to transmit the first voltage to the detection circuit by the first pin, the third switch comprises a first end and a second end, the first end of the third switch is coupled to the ground terminal, and the second end of the third switch is coupled to the second end of the second switch.

5. The voltage conversion apparatus according to claim 1, further comprising:
   a boot circuit, coupled between the voltage conversion circuit and the protective circuit, wherein the boot circuit generates the second voltage based on the first voltage, and the boot circuit transmits the second voltage to the detection circuit by using a second pin of the protective circuit.

6. The voltage conversion apparatus according to claim 1, wherein the power supply circuit further comprises a fifth switch, and the fifth switch and the first switch are connected with each other in a series opposing connection, to transmit the power.

7. A control method for a voltage conversion apparatus, comprising:
   transmitting a power by a first switch of a power supply circuit to generate an input voltage;
   receiving the input voltage by a second switch of a voltage conversion circuit, wherein a third switch is coupled between the second switch and a ground terminal;
   generating an output voltage and a first voltage based on the input voltage by the voltage conversion circuit; and
   generating a first control signal based on the first voltage, a second voltage that corresponds to the first voltage, and a reference voltage by using a detection circuit of a protective circuit,
   wherein when a voltage value of an error signal is less than the reference voltage, the detection circuit outputs the first control signal to turn off the first switch, and the voltage value of the error signal corresponds to a voltage difference between the first voltage and the second voltage.

8. The control method for a voltage conversion apparatus according to claim 7, wherein the step of generating the first control signal comprises:
   generating the error signal based on the first voltage and the second voltage by an error amplifier;
   comparing the voltage value of the error signal with the reference voltage to generate a second control signal by a comparator; and
   turning on or turning off a fourth switch of the detection circuit based on the second control signal to generate the first control signal.

9. The control method for a voltage conversion apparatus according to claim 8, further comprising:
   when the voltage value of the error signal is less than the reference voltage, disabling a first control circuit of the protective circuit based on the second control signal, to stop the first control circuit from outputting a third voltage to a control end of the second switch and to stop the first control circuit from outputting a fourth voltage to a control end of the third switch.

10. The control method for a voltage conversion apparatus according to claim 7, wherein the step of generating the first voltage comprises:
    receiving the input voltage by a first end of the second switch to generate the first voltage at a second end of the second switch; and
    transmitting the first voltage from the second end of the second switch to the detection circuit by a first pin of the protective circuit.

11. The control method for a voltage conversion apparatus according to claim 7, further comprising:
    generating the second voltage based on the first voltage by a boot circuit; and
    transmitting the second voltage from the boot circuit, to the detection circuit by a second pin of the protective circuit.

* * * * *